US012640113B2

(12) United States Patent
Zheng et al.

(10) Patent No.: US 12,640,113 B2
(45) Date of Patent: May 26, 2026

(54) DISPLAY PANEL, DRIVING CHIP, AND DISPLAY APPARATUS

(71) Applicant: Xiamen Tianma Optoelectronics Co., Ltd., Xiamen (CN)

(72) Inventors: Qiaoning Zheng, Xiamen (CN); Dongquan Hou, Xiamen (CN)

(73) Assignee: Xiamen Tianma Optoelectronics Co., Ltd., Xiamen (CN)

( * ) Notice: Subject to any disclaimer, the term of this patent is extended or adjusted under 35 U.S.C. 154(b) by 0 days.

(21) Appl. No.: 19/058,046

(22) Filed: Feb. 20, 2025

(65) Prior Publication Data

US 2026/0120660 A1 Apr. 30, 2026

(30) Foreign Application Priority Data

Oct. 25, 2024 (CN) .......................... 202411501672.0

(51) Int. Cl.
| | |
|---|---|
| *G09G 3/36* | (2006.01) |
| *G02F 1/1343* | (2006.01) |
| *G02F 1/1362* | (2006.01) |
| *G02F 1/1368* | (2006.01) |
| *G11C 19/28* | (2006.01) |

(52) U.S. Cl.
CPC ..... *G09G 3/3677* (2013.01); *G02F 1/134309* (2013.01); *G02F 1/136286* (2013.01); *G02F 1/1368* (2013.01); *G11C 19/287* (2013.01); *G09G 2300/0426* (2013.01); *G09G 2310/0286* (2013.01); *G09G 2330/021* (2013.01)

(58) Field of Classification Search
CPC ......... G09G 3/3677; G09G 2300/0426; G09G 2310/0286; G09G 2330/021; G02F 1/134309; G02F 1/136286; G02F 1/1368; G11C 19/287
See application file for complete search history.

(56) References Cited

U.S. PATENT DOCUMENTS

| | | | |
|---|---|---|---|
| 2004/0145552 A1 | 7/2004 | Song et al. | |
| 2014/0168181 A1* | 6/2014 | Furuta ..................... | G11C 19/28 |
| | | | 377/64 |
| 2016/0018844 A1* | 1/2016 | Sasaki ..................... | G11C 19/28 |
| | | | 713/600 |
| 2016/0027527 A1* | 1/2016 | Murakami ........... | G09G 3/3648 |
| | | | 377/64 |
| 2016/0070294 A1* | 3/2016 | Chung ..................... | G09G 5/12 |
| | | | 331/8 |

FOREIGN PATENT DOCUMENTS

| | | |
|---|---|---|
| CN | 103268747 A | 8/2013 |
| KR | 100632211 B1 | 10/2006 |

OTHER PUBLICATIONS

The First Office Action dated Feb. 11, 2026 for the Chinese Application No. 202411501672.0 , 18 pages.

* cited by examiner

*Primary Examiner* — Pegeman Karimi
(74) *Attorney, Agent, or Firm* — East IP P.C.

(57) ABSTRACT

The present application discloses a display panel, a driving chip, and a display apparatus. The display panel includes a gate driving circuit including a plurality of shift registers in a cascaded connection, and the shift register includes a first transistor that is provided with a power supply voltage through a resistor structure.

19 Claims, 14 Drawing Sheets

① ② ③ ④

CLK

STV

PU

PD

Gout

RESET

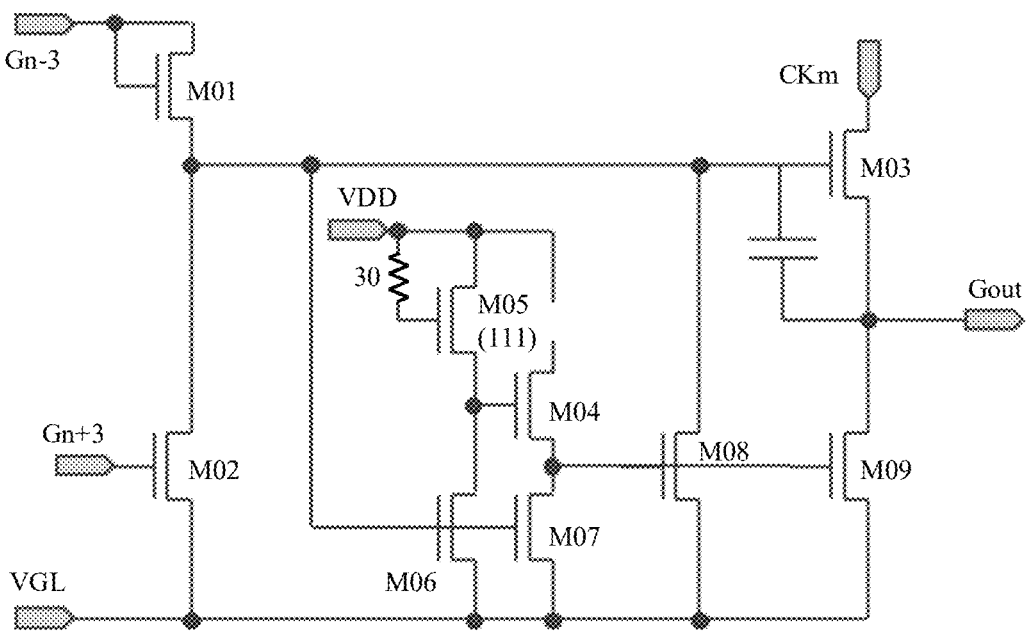
Fig. 7
<u>301</u>
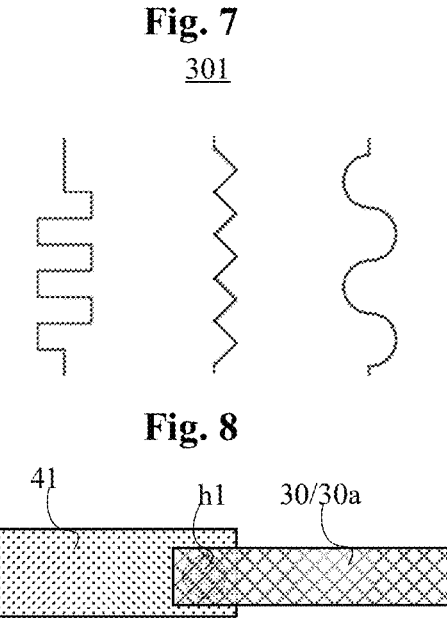
Fig. 8
Fig. 9

DISPLAY PANEL, DRIVING CHIP, AND DISPLAY APPARATUS

CROSS-REFERENCE TO RELATED APPLICATION

The present application claims priority to Chinese patent application No. 202411501672.0, entitled "DISPLAY PANEL, DRIVING CHIP, AND DISPLAY APPARATUS", filed on Oct. 25, 2024, the entire contents of which are incorporated here by reference.

TECHNICAL FIELD

The present application relates to the field of display technology, and particularly, to a display panel, a driving chip, and a display apparatus.

BACKGROUND

A display panel typically includes pixels and a gate driving circuit that is configured to provide gate control signals for the pixels to control the writing of data signals into the pixels, and the like.

With the development of display technology, requirements for reliability of the display panels have been increasing. Under a condition that transistors in the gate driving circuit are easily damaged, the normal operation of the gate driving circuit is affected, thereby affecting the reliability of the display panel.

SUMMARY

Embodiments of the present application provide a display panel, a driving chip, and a display apparatus, so that the problem that the transistor is easily damaged can be reduced.

In a first aspect, embodiments of the present application provide a display panel, and the display panel includes a gate driving circuit including a plurality of shift registers in a cascaded connection, and the shift register includes a first transistor that is provided with a power supply voltage through a resistor structure.

Based on the same inventive concept, in a second aspect, embodiments of the present application provide a driving chip configured to provide a power supply voltage for a gate driving circuit in a display panel, the power supply voltage provided by the driving chip is at a first level in the first phase, at a second level in a second phase, and at a third level in a third phase, the third phase is located between the first phase and the second phase, the third level is between the first level and the second level, and at the first level, a first transistor in the gate driving circuit is turned on.

Based on the same inventive concept, in a third aspect, embodiments of the present application provide a driving chip including a signal generation circuit and a signal delay structure, the signal generation circuit is configured to generate a power supply voltage, one end of the signal delay structure is electrically connected to an output of the signal generation circuit, and the other end of the signal delay structure is electrically connected to a gate driving circuit in a display panel.

Based on the same inventive concept, in a fourth aspect, embodiments of the present application provide a display apparatus including the display panel according to any one of the embodiments in the first aspect, and/or the driving circuit according to any one of the embodiments in the second aspect or the third aspect.

The above description is merely an overview of the technical solutions of the present application. In order to make the technical means of the present application understood more clearly and implemented according to the contents of the description, and in order to make the above and other objects, features and advantages of the present application understood more obviously, specific detailed description of the present application are particularly provided below.

BRIEF DESCRIPTION OF THE DRAWINGS

Other features, objects and advantages of the present application will become more apparent from reading the following detailed description of the non-limiting embodiments with reference to the drawings, in which the same or similar reference numerals represent the same or similar features, and the drawings are not drawn to actual scale.

FIG. 7 shows yet another schematic structural view of a circuit of a shift register in a display panel according to embodiments of the present application;

FIG. 8 shows some schematic structural views of a resistor structure in a display panel according to embodiments of the present application;

FIG. 9 shows a schematic structural view of traces in a display panel according to embodiments of the present application;

DETAILED DESCRIPTION

Figure 1:
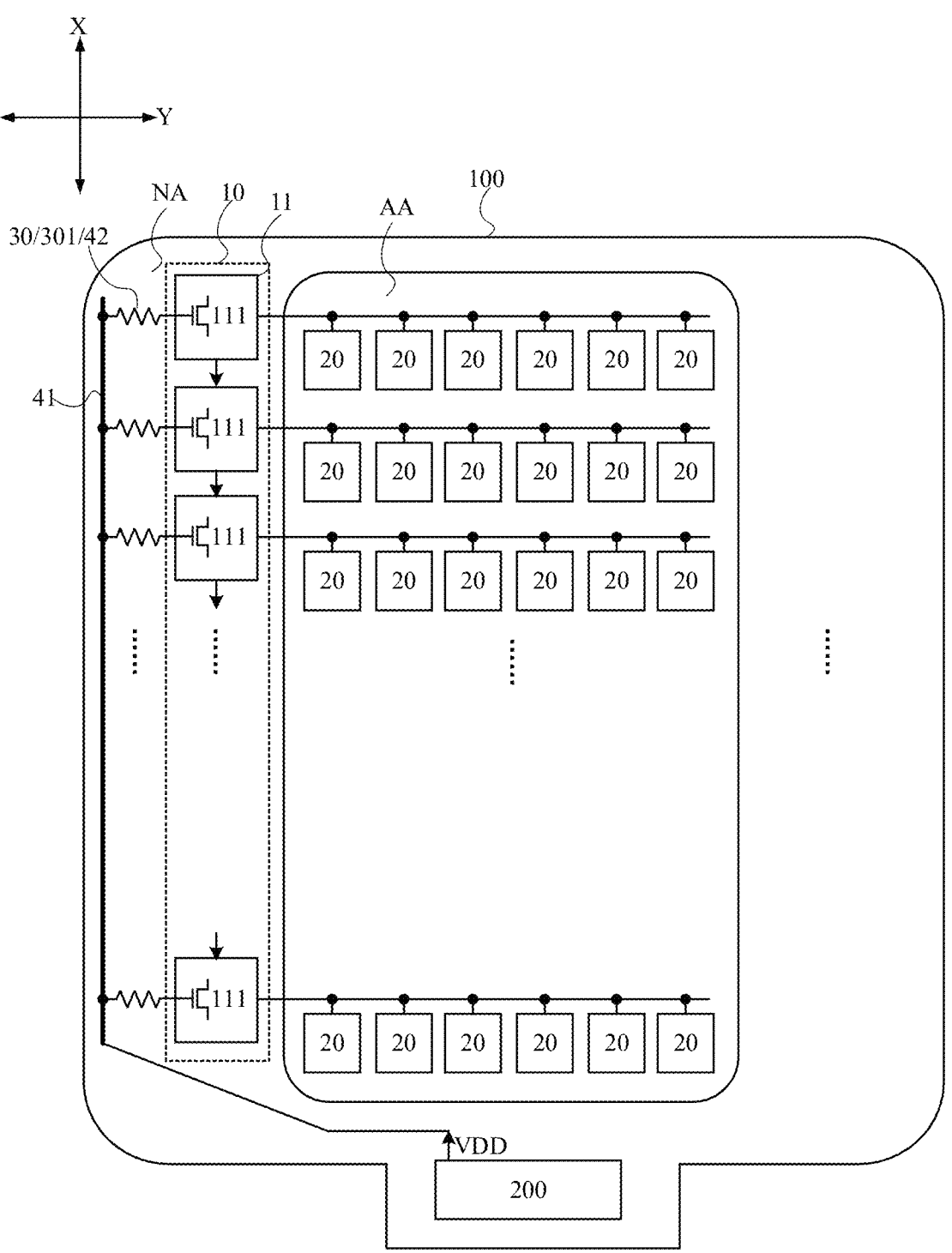
FIG. 1 shows a schematic structural top view of a display panel according to embodiments of the present application.

Features and exemplary embodiments of various aspects of the present application will be described in detail below. In order to make the objects, technical solutions and advantages of the present application clearer, the present application is further described in detail below with reference to the drawings and specific embodiments. It should be understood that the specific embodiments described herein are only used to explain the present application, but not to limit the present application. For those skilled in the art, the present application can be implemented without some of these specific details. The following description of the embodiments is only to provide a better understanding of the present application by illustrating examples of the present application.

It should be noted that, in the present disclosure, the relational terms, such as first and second, are used merely to distinguish one entity or operation from another entity or operation, without necessarily requiring or implying any actual such relationships or orders for these entities or operations. Moreover, the terms "comprise", "include", or any other variants thereof, are intended to represent a non-exclusive inclusion, such that a process, method, article or device including a series of elements includes not only those elements, but also other elements that are not explicitly listed or elements inherent to such a process, method, article or device. Without more constraints, the elements following an expression "comprise/include . . . " do not exclude the existence of additional identical elements in the process, method, article or device that includes the elements.

It should be understood that when the structure of a component is described, if a layer/area is referred to as being "on" or "above" another layer/region, it may mean that the layer/area is directly on the other layer/region or that other layers/regions may be included between the layer/area and the other layer/area. Moreover, if the component is turned over, the layer/area will be "below" or "under" the other layer/area.

It should be understood the term "and/or" used herein refers to only an association relationship for describing associated objects, and means that there may be three kinds of relationships. For example, "A and/or B" may represent three cases including: "A exists alone", "A and B exist simultaneously", and "B exists alone". In addition, the character "/" herein generally indicates that the associated objects have an "or" relationship.

In the description of the embodiments of the present application, the technical terms "mounted", "connected", "connection", "fixed", and the like should be interpreted in a broad sense, for example, they may refer to a fixed connection, a detachable connection or integration; a mechanical connection, or an electrical connection; a direct connection, an indirect connection through an intermediate medium, or an internal connection or an interaction relationship between two elements. For those of ordinary skill in the art, the specific meanings of the above-mentioned terms in the embodiments of the present application can be understood in accordance with specific conditions.

It will be apparent to those skilled in the art that various modifications and variations can be made to the present application without departing from the gist or scope of the present application. Accordingly, the present application is intended to encompass the modifications and variations to the present application that fall within the scope of the appended claims (the claimed technical solutions) and equivalents thereof. It should be noted that the implementations provided by the embodiments of the present application can be combined with one another if there is no conflict.

Before the technical solutions provided by the embodiments of the present application are described, related technical problems are first described in the present application to facilitate the understanding of the embodiments of the present application.

The inventor of the present application has found that, under a condition that a display panel is in a high temperature operating environment, a bias voltage in a gate driving circuit is relatively high, and a transistor device that is turned on for a long duration is easily damaged.

For a transistor that needs to be provided with a power supply voltage (VDD signal), under a condition that the VDD signal changes from an OFF-level to an On-level (herein, the OFF-level refers to the level that controls the transistor to be turned off, and the ON-level refers to the level that controls the transistor to be turned on), the transistor that is controlled by the VDD signal is directly impacted by a high level and a great current, and under a condition that the transistor is turned on for a long duration, the transistor is easily damaged. However, after the transistor is damaged, corresponding nodes in the gate driving circuit cannot be controlled, causing the gate driving circuit to lose corresponding functions, resulting in abnormal operation of the gate driving circuit, and further causing display abnormality of the display panel (for example, transverse stripes appear on the display screen).

In view of the above research findings of the inventor, changing the power supply voltage actually received by the transistor is considered in embodiments of the present application; under a condition that potential of the power supply voltage changes, it is avoided that the transistor actually receives instant excessively high potential and is impacted by the great instantaneous current to reduce the instantaneous current passing through the transistor, reducing the problem that the transistor is easily damaged, and improving reliability of the gate driving circuit and the display panel.

A display panel, a driving chip, and a display apparatus according to embodiments of the present application will be described below with reference to the drawings.

Figure 2:
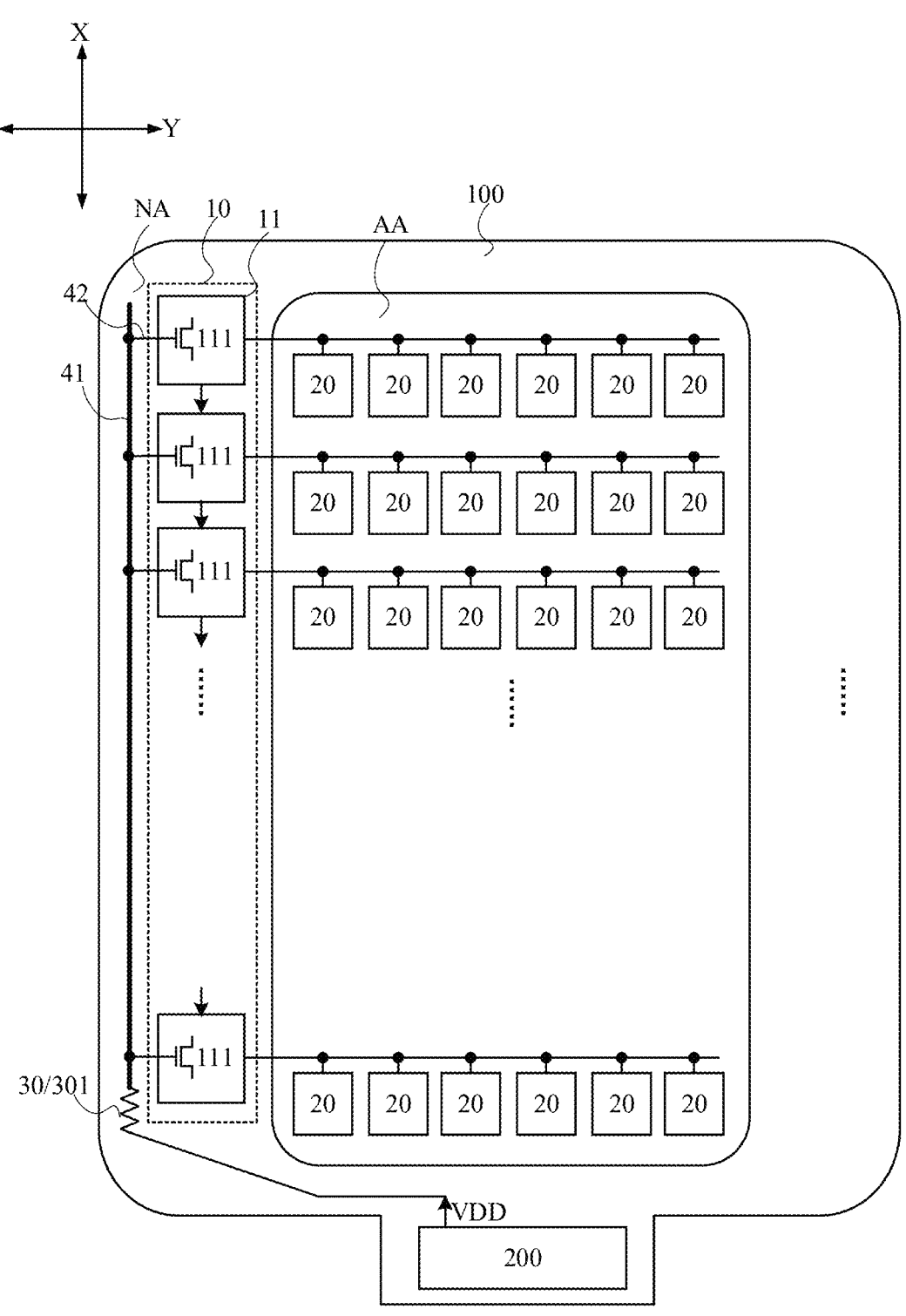
FIG. 2 shows another schematic structural top view of a display panel according to embodiments of the present application.

As shown in FIG. 1 or FIG. 2, the display panel 100 according to embodiments of the present application includes the gate driving circuit 10 including a plurality of shift registers 11 in a cascaded connection. In the drawing, an example is given in which an output signal of the shift register 11 of the previous stage is used as a trigger signal of the shift register 11 of the next stage, and a cascade relationship among the shift registers 11 is not limited to herein; the output signal of the shift register of the current stage may be used as the trigger signal of the shift register after several stages.

In an example, the display panel 100 includes the display area AA and the non-display area NA surrounding the display area AA. The gate driving circuit 10 is located in the non-display area NA. The display area AA includes a plurality of pixels 20. An output of the shift register 11 is electrically connected to the pixels 20, and a signal output by the shift register 11 is used for driving the pixels 20.

The signal output by the shift register 11 may include a scanning signal, a light-emitting control signal, and the like.

Under a condition that the display panel is a liquid crystal display panel, the pixel 20 may include a switching tube, and the signal output by the shift register 11 controls the switching tube to be turned on, so that a data line provides a data voltage for a pixel electrode through the switching tube.

The shift registers 11 each include the first transistor 111 that is provided with the power supply voltage VDD through the resistor structure 30. The power supply voltage VDD is provided by a driving circuit such as the driving chip 200; and it may be understood that a path across which the power supply voltage VDD is transmitted from an output of the driving chip 200 to the first transistors 111 passes through the resistor structure 30.

In an example, a gate of the first transistor 111 is provided with the power supply voltage VDD through the resistor structure 30. The power supply voltage VDD is used for controlling states of the first transistors 111. For example, under a condition that the power supply voltage VDD is at the first level, the first transistors 111 are turned on; under a condition that the power supply voltage VDD is at the second level, the first transistors 111 are turned off. Under a condition that the first transistors 111 are N-type transistors, the second level is lower than the first level, the first level is the high level vgh, and the second level is the low level vgl. Correspondingly, under a condition that the first transistors are P-type transistors, the first level is the low level vgl, and the second level is the high level vgh.

In an example, the display panel 100 further includes the power supply trace 41 for transmitting the power supply voltage VDD. The driving chip 200 is configured to provide the power supply voltage VDD, and the power supply voltage VDD output by the driving chip 200 is transmitted to the first transistors 111 through the power supply trace 41 and the resistor structure 30.

As an example, as shown in FIG. 1, the resistor structures 30 are connected between the shift registers 11 and the power supply trace 41. Under this condition, the power supply voltage VDD output by the driving chip 200 is first transmitted to the power supply trace 41, next to the resistor structures 30, and then to the first transistors 111.

As another example, as shown in FIG. 2, the resistor structure 30 is connected between the driving chip 200 and the power supply trace 41. Under this condition, the power supply voltage VDD output by the driving chip 200 is first transmitted to the resistor structure 30, next to the power supply trace 41, and then to the first transistors 111.

Some structures of the shift register will be exemplarily described below.

Figures 3, 4:
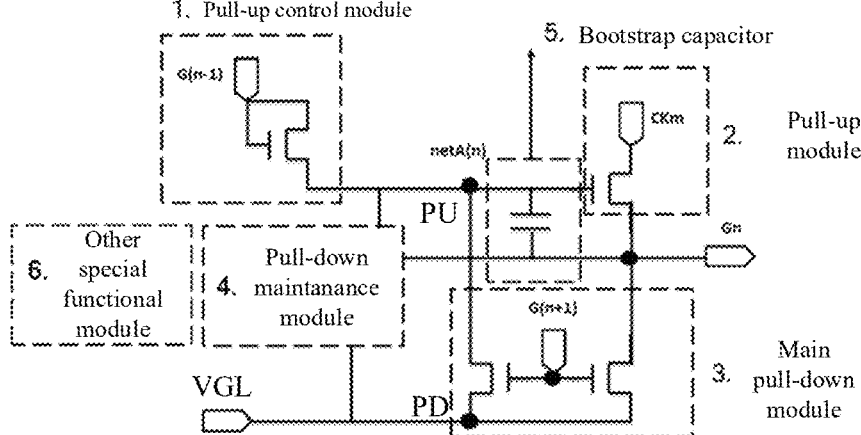
FIG. 3 shows a schematic structural view of a circuit of a shift register in a display panel according to embodiments of the present application.
FIG. 4 shows a time sequence corresponding to FIG. 3.

In an example, circuit architectures of the shift register 11 include, but are not limited to, the circuit architecture shown in FIG. 3. As shown in FIG. 3, the circuit architecture of the shift register 11 may include the pull-up control module 1, the pull-up module 2, the main pull-down module 3, the pull-down maintenance module 4, and the bootstrap capacitor 5. The pull-up control module 1 is configured to precharge the shift register, the pull-up module 2 is configured to drive the pixels of the display area, the main pull-down module 3 is configured to pull down the node Gn and the node netA, the pull-down maintenance module 4 is configured to maintain the potential of the point PD to be stable, and the bootstrap capacitor 5 is configured to raise the potential of the node netA. Herein, the node netA and the point PU may be understood as the nodes that have the same potential.

In an example, the shift register 11 may be designed to include other functional modules 6 based on other needs.

As shown in FIG. 4, the operation of the shift register 11 may generally be divided into four phases.

In phase ①, the pull-up control module 1 controls the trigger signal STV to enter, the point PU is raised for the first time, and the point PD is pulled low;

In phase ②, the bootstrap capacitor 5 operates, and the point PU is raised for the second time;

In phase ③, the main pull-down module 3 operates, the reset signal RESET enters, the point PU is pulled low, and the point PD starts to rise;

In phase ④, the pull-down maintenance module 4 operates, the point PD maintains to be at the high potential and continues to empty the charge of the circuit, and is not pulled low until the next time the point PU rises.

The power supply voltage VDD is used for providing the potential of the point PD. The variation frequency of the power supply voltage VDD may not be high; for example, under a condition that the transistor controlled by the power supply voltage VDD is the N-type transistor, the power supply voltage VDD may be maintained at high potential for a long duration.

Figure 5:
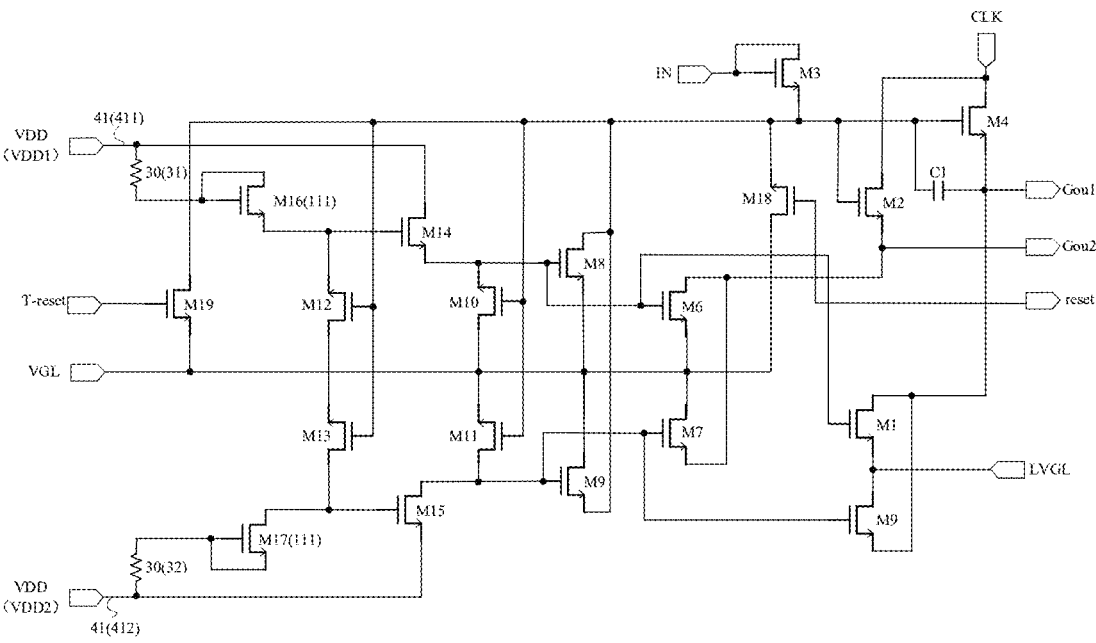
FIG. 5 shows a schematic structural view of a circuit of a shift register in a display panel according to embodiments of the present application.

In some optional examples, the specific circuit structure of the shift register 11 may be as shown in FIG. 5, and the transistor M16 and the transistor M17 need to be provided with the power supply voltage VDD; in order to distinguish, the power supply voltage VDD provided for the transistor M16 is labeled as the first power supply voltage VDD1, and the power supply voltage VDD provided for the transistor M17 is labeled as the second power supply voltage VDD2. Herein, the first transistor 111 includes the transistor M16 and the transistor M17 that may be provided with the first power supply voltage VDD1 and the second power supply voltage VDD2 through different resistor structures 30, respectively.

Figure 6:
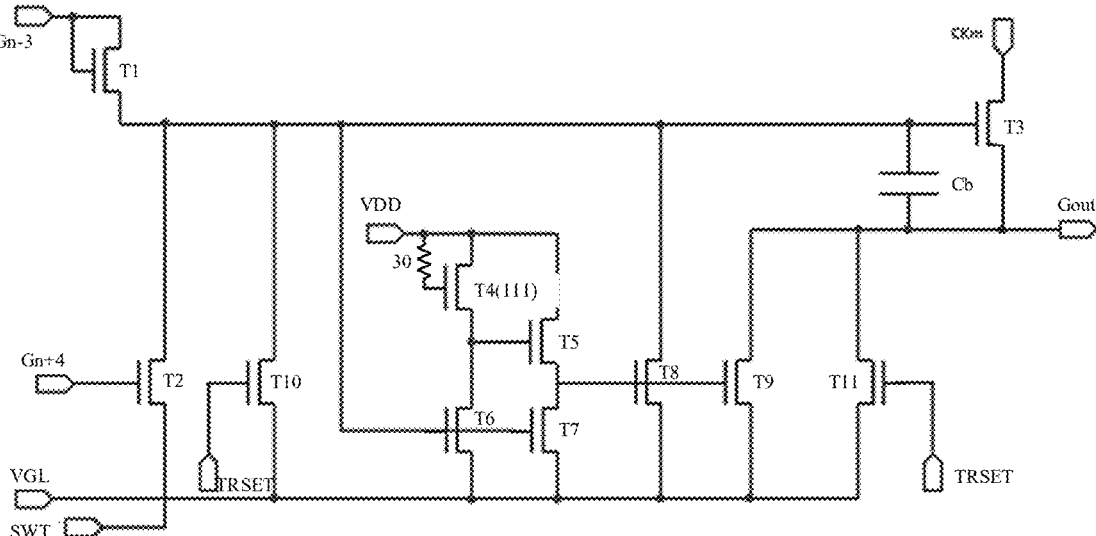
FIG. 6 shows another schematic structural view of a circuit of a shift register in a display panel according to embodiments of the present application.

In some other optional examples, the specific circuit structure of the shift register 11 may be as shown in FIG. 6, and the transistor T4 needs to be provided with the power supply voltage VDD; herein, the first transistor 111 includes the transistor T4 that is provided with the power supply voltage VDD through the resistor structure 30.

In yet some other optional examples, the specific circuit structure of the shift register 11 may be as shown in FIG. 7, and the transistor M05 needs to be provided with the power supply voltage VDD; herein, the first transistor 111 includes the transistor M05 that is provided with the power supply voltage VDD through the resistor structure 30.

It should be noted that the technical concept of the present application has general applicability, and specific structures of the shift register are not limited, and the structures and time sequences shown in FIG. 3 to FIG. 7 are only some examples and are not intended to limit the present application. For example, the circuit structures of the shift register shown in FIG. 5 to FIG. 7 are 19T1C, 11T1C, and 9T1C, respectively, and structures of the shift register include, but are not limited to, 19T1C, 11T1C, 9T1C, 9T2C, 12T1C, 17T1C, 21T1C, and the like; herein "19T1C" means that the shift register has 19 transistors and 1 capacitor, which is similar for other structures and will not be repeated.

Under a condition that the power supply voltage changes, the instantaneous current I is generated in the transmission path of the power supply voltage. For example, under a condition that the power supply voltage changes from the low potential vgl to the high potential vgh, the instantaneous current I is generated in the transmission path of the power supply voltage; under a condition that the power supply voltage is directly provided for the first transistor without passing through the resistor structure, the first transistor receives the high potential vgh, the source-drain voltage difference Vds of the first transistor is relatively big, and the current passing through the first transistor is relatively great, easily damaging the first transistor. However, in the embodiments of the present application, the first transistor is provided with the power supply voltage VDD through the resistor structure 30; under a condition that the power supply voltage VDD changes from the low potential vgl to the high potential vgh, the instantaneous current generated in the transmission path of the power supply voltage VDD generates the voltage drop ΔV on the resistor structure; the resistance of the resistor structure 30 is labeled as R, ΔV=I*R, the potential received by the first transistor is reduced to vgh −ΔV, and the current passing through the first transistor is correspondingly reduced. As such, the the great current impact on the first transistor due to the instantaneous change of the provided power supply voltage VDD may be reduced, that is, the direct impact of the change of the power supply voltage VDD on the first transistor is avoided to reduce the instantaneous current passing through the first transistor, reducing the problem that the first transistor is easily damaged and improving the reliability of the gate driving circuit and the display panel.

It may be understood that the instantaneous current is generated in the transmission path of the power supply voltage VDD only when the power supply voltage VDD changes, so that the resistor structure 30 reduce the voltage only when the power supply voltage VDD changes. Under a condition that the power supply voltage VDD does not change any more, almost no current passes through the transmission path of the power supply voltage VDD, and the resistor structure will not have the function of reducing the voltage any more. Therefore, providing the resistor structure is equivalent to adding a delay when the signal changes abruptly, and the resistor structure acts as a buffer and does not affect the normal operating potential of the device and the normal operation of the shift register.

For example, under a condition that the first transistor is the N-type transistor, and the voltage difference Vgs between the gate and the source thereof is greater than the threshold voltage Vth thereof, the first transistor is turned on, and the current passes through; and under a condition that the power supply voltage VDD changes from the low potential vgl to the high potential vgh, the resistor structure has the delay effect. Under a condition that the power supply voltage VDD changes from the high potential vgh to the low potential vgl, the N-type first transistor is turned off and no current passes through.

For another example, under a condition that the first transistor is the P-type transistor, and the voltage difference Vgs between the gate and the source thereof is less than the threshold voltage Vth thereof, the first transistor is turned on, and the current passes through; and under a condition that the power supply voltage VDD changes from the high potential vgh to the low potential vgl, the resistor structure has the delay effect. Under a condition that the power supply voltage VDD changes from the low potential vgl to the high potential vgh, the P-type first transistor is turned off and no current passes through.

Some examples of the resistor structure will be exemplarily described below.

In some embodiments, as shown in FIG. 1 or FIG. 2, the display panel includes the power supply trace 41 for transmitting the power supply voltage VDD, and the resistor structure 30 includes the first trace 301. The first trace 301 may be connected between the power supply trace 41 and the first transistor 111, or the first trace 301 may be connected to the first transistor 111 through the power supply trace 41.

As an example, an impedance of per unit length of at least a part of the segments of the first trace 301 is greater than an impedance of per unit length of the power supply trace 41. Herein, the impedance of the first trace 301 may be designed to be uniform, that is, the impedance of per unit length of the segments of the first trace 301 at different locations is the same; or the impedance of per unit length of one part of the segments of the first trace 301 is greater than the impedance of per unit length of the power supply trace 41, and the impedance of per unit length of the other part of the segments of the first trace 301 may not be limited.

It may be understood that both the first trace 301 and the power supply trace 41 are used for transmitting the power supply voltage VDD. Within the same length, the impedance of the first trace 301 is greater than the impedance of the power supply trace 41. In an example, the total impedance of the first trace 301 is greater than the total impedance of the power supply trace 41.

In order to reduce the effect of the signal voltage drop on the display performance, the total impedance of the power supply trace 41 is typically set to be relatively small and even negligible. In the embodiments of the present application, the resistor structure includes the first trace, that is, the resistor structure is designed as a trace structure, so that the first trace may be manufactured by directly using the existing trace manufacturing process, which is relatively easy to achieve; in addition, the impedance of per unit length of the first trace is relatively big, which is more beneficial to reduce the impact of the change of the power supply voltage VDD on the first transistor, thereby protecting the first transistor from being damaged.

In some embodiments, as shown in FIG. 1 or FIG. 2, the display panel includes the power supply trace 41 for transmitting the power supply voltage VDD, and the resistor structure 30 includes the first trace 301. A trace width of the first trace 301 is less than a trace width of the power supply trace 41. Under a condition that the materials are the same, the less the trace width is, the greater the impedance of the trace will be. In the embodiments of the present application, designing the trace width of the first trace to be relatively small can increase the impedance of the transmission path of the power supply voltage VDD to the first transistor to reduce the impact of the change of the power supply voltage VDD on the first transistor, thereby protecting the first transistor from being damaged.

In some other embodiments, the transmission path of the power supply voltage VDD output from the driving chip 200 to the first transistor may be increased. For example, trace lengths of traces on a part of locations (such as the location where the first trace 301 is located) on the transmission path may be increased.

As an example, as shown in FIG. 8, the resistor structure includes the first trace 301 that includes a meander line. Designing the first trace to extend in meander line can increase the total length of the first trace in a limited space to increase the impedance of the transmission path of the power supply voltage VDD to the first transistor and reduce the impact of the change of the power supply voltage VDD on the first transistor, thereby protecting the first transistor from being damaged.

In some examples, as shown in FIG. 8, the meandering pattern of the first trace 301 may include, but is not limited to, any one of a square wave, a zigzag, and a serpentine in shape.

As an example, under a condition that the total length of the transmission path of the power supply voltage VDD output from the driving chip 200 to the first transistor is constant, only trace lengths of traces on a part of locations (such as the location where the first trace 301 is located) on the transmission path may be reduced.

As another example, under a condition that the width of the transmission path of the power supply voltage VDD is constant, the total length of the transmission path of the power supply voltage VDD to the first transistor may be increased (for example, the length of the first trace may be increased).

As another example, the trace lengths of the traces on a part of the locations (such as the location where the first trace 301 is located) on the transmission path may be reduced, and the total length of the transmission path of the power supply voltage VDD to the first transistor may be increased (for example, the length of the first trace may be increased).

It may be understood that under a condition that the trace width of the first trace 301 is less than the trace width of the power supply trace 41, the impedance of per unit length of the first trace 301 is greater than the impedance of per unit length of the power supply trace 41. In some other examples, different materials may be used for manufacturing the first trace 301 and the power supply trace 41, respectively, and the impedance of the material used for the first trace 301 is greater to satisfy that the impedance of per unit length of the first trace 301 is greater than the impedance of per unit length of the power supply trace 41.

In some embodiments, as shown in FIG. 1 or FIG. 2, the display panel includes the power supply trace 41 for transmitting the power supply voltage VDD. With reference to FIG. 9, the resistor structure 30 includes at least the first segment 30a, and the first segment 30a and the power supply trace 41 are located in different layers.

Traces in different film layers are shown with different fillings in FIG. 9. Under a condition that the first segment 30a and the power supply trace 41 are located in different layers, the two may be connected through the via h1. One end of the via h1 is overlapped with the power supply trace 41, and the other end is overlapped with the first segment 30a.

Since the first segment 30a and the power supply trace 41 are located in different layers, the first segment 30a may not be limited by the power supply trace 41, and structural features and/or material features of the first segment 30a may be designed more freely, facilitating more flexible designing of the first segment 30a.

In an example, the material of the first segment 30a includes a transparent conductive material or a semiconductor material.

As an example, the transparent conductive material includes indium tin oxide (ITO). The material of the power supply trace 41 typically includes a metal element (such as copper, aluminum, molybdenum, and titanium) or alloy, the metal element or the alloy has a relatively low impedance. The impedance of the ITO is much greater, and typically, the impedance of the ITO is 500 times or more that of the metal such as copper and aluminum.

Under a condition that the power supply trace 41 is a conductor, and the first segment 30a includes the semiconductor material, the first segment 30a is the semiconductor, the resistance of the semiconductor is greater than the resistance of the conductor, and the conductivity of the semiconductor is lower than the conductivity of the conductor.

As an example, the semiconductor material in the first segment 30a may be the same as the semiconductor material in the transistor in the gate driving circuit. For example, the first segment 30a includes doped A-Si. Herein, the first segment 30a may refer to a conductorized semiconductor trace that has been doped; it may be understood that the doped semiconductor trace does not conductorize the trace directly and can pass the current, but has a relatively great resistance, so that the current passing through is relatively small.

Figure 10:
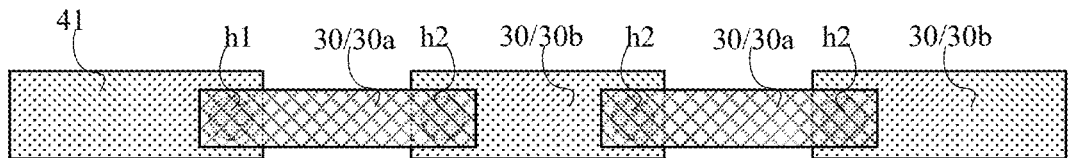
FIG. 10 shows another schematic structural view of traces in a display panel according to embodiments of the present application.

In some embodiments, as shown in FIG. 10, the resistor structure 30 further includes the second segment 30b that is electrically connected to the first segment 30a, and the second segment 30b and the first segment 30a are located in different layers.

In an example, the resistor structure 30 may include a plurality of first segments 30a and a plurality of second segments 30b. The first segment 30a and the second segment 30b are alternately arranged, and the first segment 30a and the second segment 30b are connected to each other through the via h2.

As an example, the second segment 30b is located in the same film layer as the power supply trace 41. Under a condition that the two are located in the same film layer, materials of the two may be the same, so that the second segment 30b and the power supply trace 41 may be manufactured simultaneously.

As another example, the second segment 30b and the power supply trace 41 are located in different film layers. Under this condition, the second segment 30b, the first segment 30a, and the power supply trace 41 are located in different film layers.

In the embodiments of the present application, the resistor structure 30 is provided as including the first segment 30a and the second segment 30b that are located in different film layers, so that it is beneficial to increase the length of the trace of the resistor structure in the same area and increase the total impedance of the resistor structure, thereby increasing the impedance of the transmission path of the power supply voltage VDD to the first transistor, reducing the impact of the change of the power supply voltage VDD on the first transistor, and protecting the first transistor from being damaged.

In some embodiments, as shown in any one of FIG. 11 to FIG. 14, the display panel further includes the pixel electrode 51 and the common electrode 52.

The display panel may be used as a display panel of a liquid crystal display and includes liquid crystal molecules 53. The pixel electrode 51 and the common electrode 52 provide an electric field for controlling the rotation of the liquid crystal molecules.

Pixels of the display panel include pixel circuits, and the pixel electrode is connected to the transistor in the pixel circuit for receiving the data voltage transmitted by the transistor in the pixel circuit. The common electrode is used for receiving a common voltage. In an example, the pixel includes sub-pixels, and the common electrodes in the plurality of sub-pixels may be electrically connected to each other.

With reference to any one of FIG. 1, and FIG. 11 to FIG. 14, the resistor structure 30 includes at least the first segment 30a, the first segment 30a and the power supply trace 41 are located in different film layers, the first segment is located in the same layer as the pixel electrode 51, and/or, the first segment 30a is located in the same layer as the common electrode 52.

In an example, the display panel further includes the base plate 54, and the pixel electrode 51 and the common electrode 52 are located on one side of the base plate 54.

Figure 11:
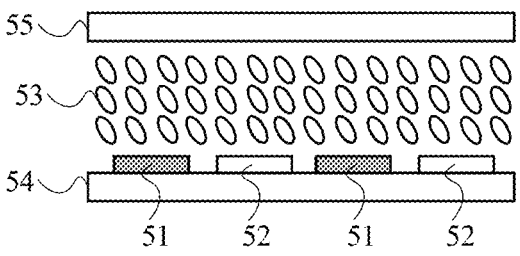
FIG. 11 shows a sectional schematic structural view of a display panel according to embodiments of the present application.

As an example, as shown in FIG. 11, the pixel electrodes 51 are located in the same layer as the common electrodes 52. Herein, the first segment, the pixel electrode 51, and the common electrode 52 may be located in the same layer.

Figure 12:
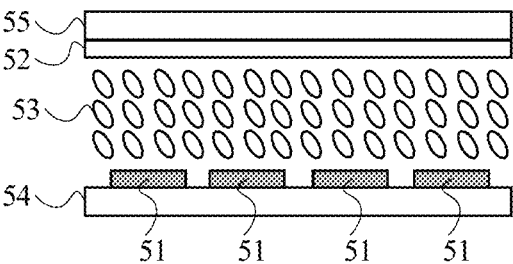
FIG. 12 shows another sectional schematic structural view of a display panel according to embodiments of the present application.
Figure 13:
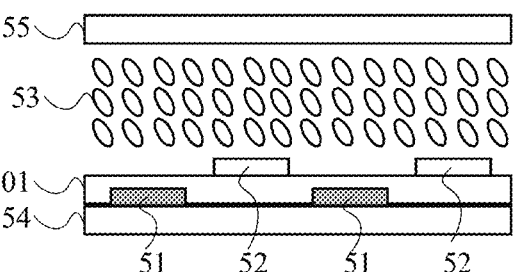
FIG. 13 shows yet another sectional schematic structural view of a display panel according to embodiments of the present application.

As another example, as shown in FIG. 12 or FIG. 13, the film layer on which the pixel electrodes 51 are located is located between the film layer on which the common electrode 52 is located and the base plate 54.

For example, the display panel further includes the counter plate 55, the liquid crystal molecules 53 are located between the base plate 54 and the counter plate 55, the pixel electrodes 51 are located on a side of the base plate 54 facing the liquid crystal molecules 53, and the common electrode 52 is located on a side of the counter plate 55 facing the liquid crystal molecules 53. For another example, as shown in FIG. 13, the pixel electrodes 51 and the common electrodes 52 are located on a side of the base plate 54 facing the liquid crystal molecules 53; along the thickness direction of the display panel, the film layer where the pixel electrodes 51 are located is located between the film layer where the common electrodes 52 are located and the base plate 54, and the pixel electrodes 51 and the common electrodes 52 are spaced apart by the insulation layer 01. Herein, the film layer where the pixel electrodes 51 are located may be provided with the first segments, and/or the film layer where the common electrodes 52 are located may be provided with the first segments.

Figure 14:
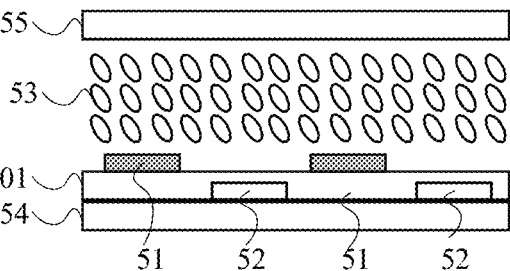
FIG. 14 shows yet another sectional schematic structural view of a display panel according to embodiments of the present application.

As yet another example, as shown in FIG. 14, the film layer where the common electrodes 52 are located is located between the film layer where the pixel electrodes 51 are located and the base plate 54. For example, the pixel electrodes 51 and the common electrodes 52 are located on a side of the base plate 54 facing the liquid crystal molecules 53; along the thickness direction of the display panel, the film layer where the common electrodes 52 are located is located between the film layer where the pixel electrodes 51 are located and the base plate 54. Herein, the film layer where the pixel electrodes 51 are located may be provided with the first segments, and/or the film layer where the common electrodes 52 are located may be provided with the first segments.

In the embodiments of the present application, the first segments of the resistor structures are located in the same film layer as the pixel electrodes and/or the common electrodes, so that the first segments and the pixel electrodes and/or the common electrodes may be manufactured simultaneously, and an additional manufacturing process is not added under a condition that additional first segments are added.

It may be understood that under a condition that the pixel electrodes and/or the common electrodes are metal electrodes, and the first segments are in the same film layer as the pixel electrodes and/or the common electrodes, the first segments are metal traces. In another embodiment, under a condition that the materials of the pixel electrodes and/or the common electrodes are ITO, and the first segments are in the same film layer as the pixel electrodes and/or the common electrodes, the materials of the first segments are ITO.

In some other embodiments, the first segments are semiconductor traces. For example, the first transistor includes an active layer, and the first segment and the active layer of the first transistor are located in the same film layer. Under this condition, the materials of the first segments and the active layers of the first transistors are the same, so that the first segments and the active layers of the first transistors may be manufactured simultaneously, and the additional manufacturing process is not added under a condition that the additional first segments are added.

Figure 15:
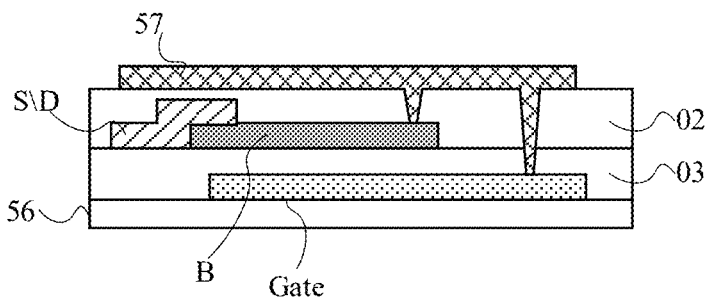
FIG. 15 shows yet another sectional schematic structural view of a display panel according to embodiments of the present application.

As an example, as shown in FIG. 15, the display panel includes the substrate 56, the gate metal layer Gate, the semiconductor layer B, the source/drain metal layer S/D, and the transparent conductive layer 57 are stacked on a side of the substrate 56, and 02 and 03 represent insulation layers. In an example, the material of the semiconductor layer B includes A-Si, the material of the transparent conductive layer 57 includes ITO, the material of the gate metal layer Gate, and the material of the source/drain metal layer S/D includes metals such as copper, aluminum, molybdenum. Impedances of the materials of the source/drain metal layer S/D, the gate metal layer Gate, the transparent conductive layer 57, and the semiconductor layer B increase in sequence. Any one or more of these film layers may be provided with the first segments of the resistor structures, traces to be connected threreto are connected by vias.

In an example, the active layer of the first transistor is located in the semiconductor layer B, and the power supply trace is located in the gate metal layer Gate. For example, the semiconductor layer B and/or the transparent conductive layer 57 with relatively great material impedances may be provided with the first segment of the resistor structure.

Figure 16:
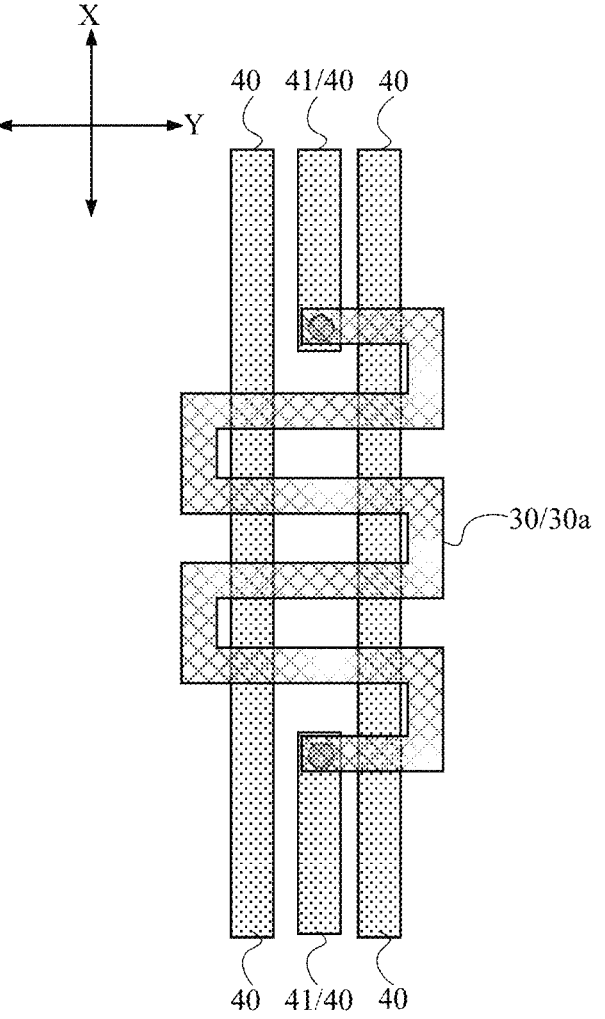
FIG. 16 shows yet another schematic structural view of traces in a display panel according to embodiments of the present application.

In some embodiments, as shown in FIG. 16, the display panel includes a plurality of transmission signal traces 40 electrically connected to the gate driving circuit, the transmission signal traces 40 include the power supply traces 41 for transmitting the power supply voltage VDD, and other transmission signal traces 40 may be used for transmitting the clock signal (CK), the trigger signal (STV), the reset signal (TRSET), the low level (LVGL), and the like.

Along the direction perpendicular to the plane where the display panel is located, the first segment 30a overlaps with the transmission signal traces 40 adjacent to the power supply traces 41. Herein, "the direction perpendicular to the plane where the display panel is located" may be understood as the thickness direction of the display panel.

For example, the plurality of transmission signal traces 40 extend along the first direction X and are arranged along the second direction Y, at least one transmission signal trace 40 is provided on each side of the power supply trace 41 along the second direction Y, and the first segment 30a overlaps with the transmission signal traces 40 on two sides of the power supply trace 41, or the first segment 30a overlaps with the transmission signal trace 40 on at least one side of the power supply trace 41. In this scheme, there is no need to provide an additional area for providing the first segments, preventing an increase in the area of the circuit layout.

The first segment 30a overlaps with the transmission signal traces 40 other than the power supply traces 41, and at least the overlapped part may form an overlapped capacitor which can also add the delay effect, thereby avoiding the direct impact of the change of the power supply voltage VDD on the first transistor to reduce the problem that the first transistor is easily damaged.

It should be noted that the number of the transmission signal traces 40 and the shape of the first segment 30a shown in FIG. 16 are not intended to limit the present application.

Figure 17:
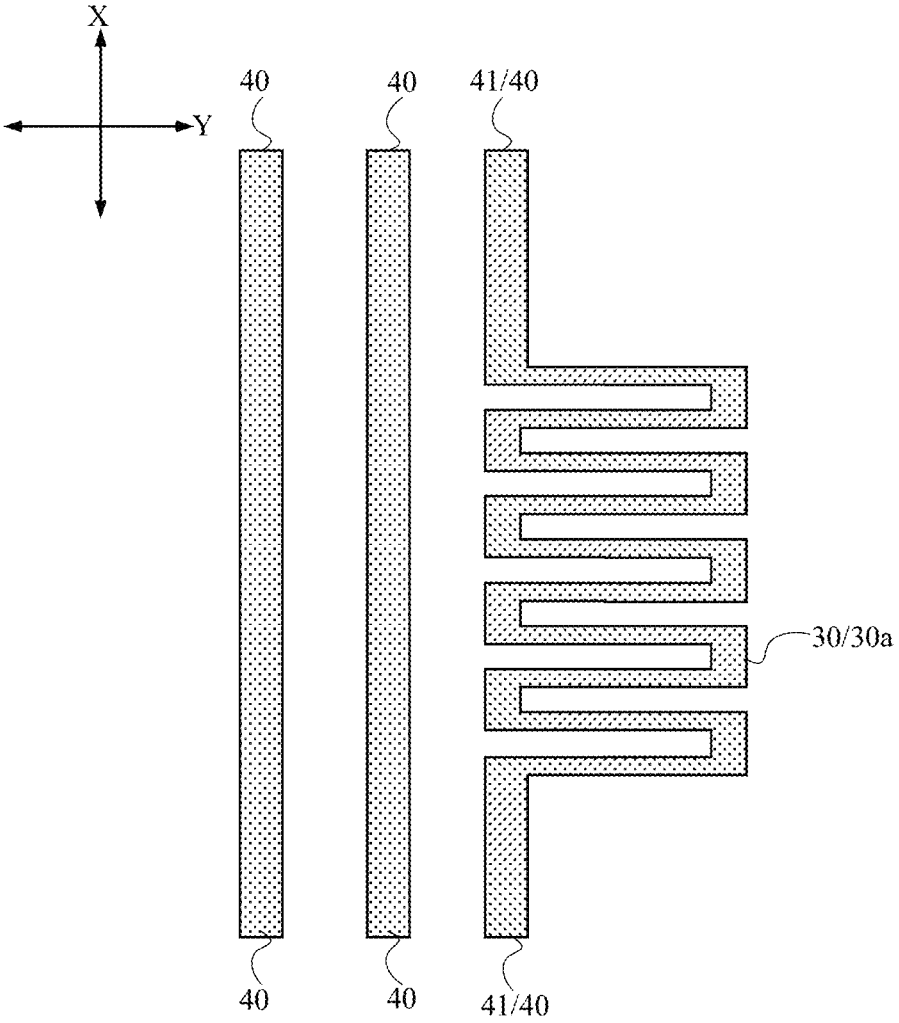
FIG. 17 shows yet another schematic structural view of traces in a display panel according to embodiments of the present application.

In some other examples, as shown in FIG. 17, the first segment 30a may be provided in the same layer as the power supply traces 41; under a condition that the first segment 30a may be provided in the same layer as the power supply traces 41, the first segment 30a may be designed to be as the meander line in the shape of the square wave, the zigzag, the serpentine, and the like to increase the length of the first segment 30a. Under this condition, along the direction perpendicular to the plane where the display panel is located, the first segment 30a does not overlap with the transmission signal traces 40.

Figure 18:
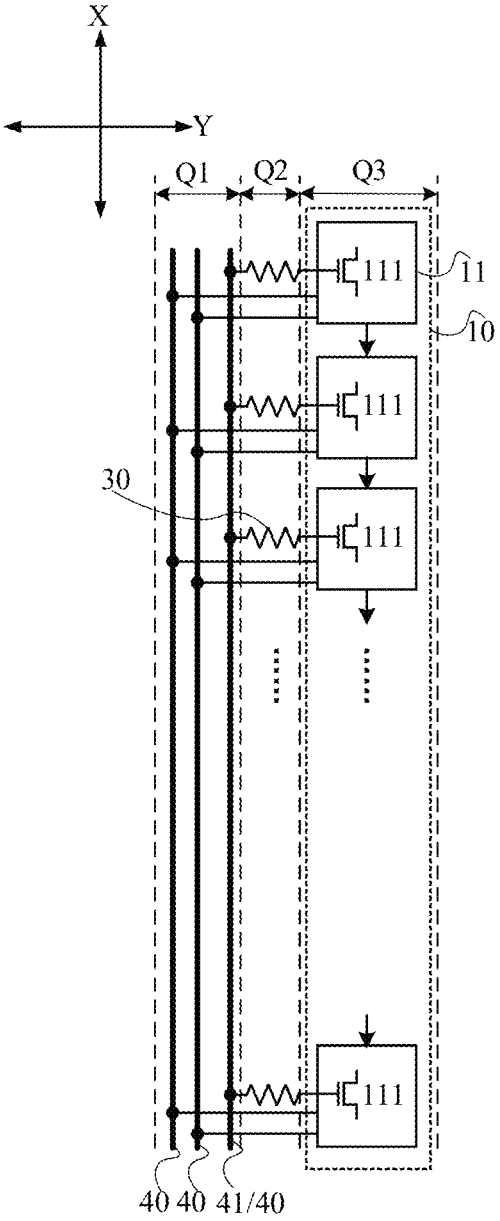
FIG. 18 shows a schematic view of a connection of traces and a circuit in a display panel according to embodiments of the present application.

In yet some other embodiments, as shown in FIG. 18, the display panel includes a plurality of transmission signal traces 40 electrically connected to the gate driving circuit 10, and the transmission signal traces 40 include the power supply trace 41. The plurality of shift registers 11 of the gate driving circuit 10 are arranged along the first direction X. The display panel includes the trace area Q1, the circuit area Q3, and the resistor area Q2, the transmission signal traces 40 are located in the trace area Q1, the gate driving circuit 10 is located in the circuit area Q3, and the resistor structures 30 are located in the resistor area Q2; along second direction Y, the resistor area Q2 is located between the trace area Q1 and the circuit area Q3, and the second direction Y intersects the first direction X.

In the trace area Q1, the plurality of transmission signal traces 40 extend along first direction X and are distributed along the second direction Y.

In an example, under a condition that different shift registers 11 are connected to different resistor structures 30, the plurality of resistor structures 30 may be arranged along the first direction X in the resistor area Q2.

In an example, under a condition that the resistor area Q2 is located in the middle along the second direction Y, connection lines between the transmission signal traces 40 other than the power supply trace 41 and the gate driving circuit 10 may pass through the resistor area Q2.

In this embodiment, the trace area Q1 is used for providing the transmission signal traces 40, the circuit area Q3 is used for providing the gate driving circuit, the resistor area Q2 is used for providing the resistor structure 30, and providing different areas facilitates flexible design of structures in various areas.

Of course, in other examples, along the second direction Y, the trace area Q1 is located in the middle, and the resistor area Q2 and the circuit area Q3 are located on two sides of the trace area Q1. Alternatively, the trace area Q1, the circuit area Q3, and the resistor area Q2 may be provided based on other positional relationships.

In some embodiments, as shown in FIG. 1, the resistor structures 30 are connected between the shift registers 11 and the power supply trace 41. As an example, the display panel includes the power supply trace 41 and the connection lines 42, the power supply trace 41 is used for transmitting the power supply voltage VDD, the plurality of shift registers 11 of the gate driving circuit 10 are arranged along the first direction X, the power supply trace 41 extends along the first direction X, and the connection lines 42 are connected between the power supply trace 41 and the first transistors 111; the connection lines 42 include the resistor structures 30.

In an example, the impedances of the connection lines 42 are greater than the impedance of the power supply trace 41.

In an example, at least a part of the segments of the connection line 42 may be the meander line of the square wave, the zigzag, the serpentine, and the like in shape.

As shown in FIG. 1, the shift registers 11 are electrically connected to the power supply trace 41 through the connection lines 42 each including the resistor structure 30. In this example, it is ensured that the first transistor of each shift register is provided with the power supply voltage VDD through the resistor structure, so that the first transistor in each shift register is protected from being easily damaged.

Figure 19:
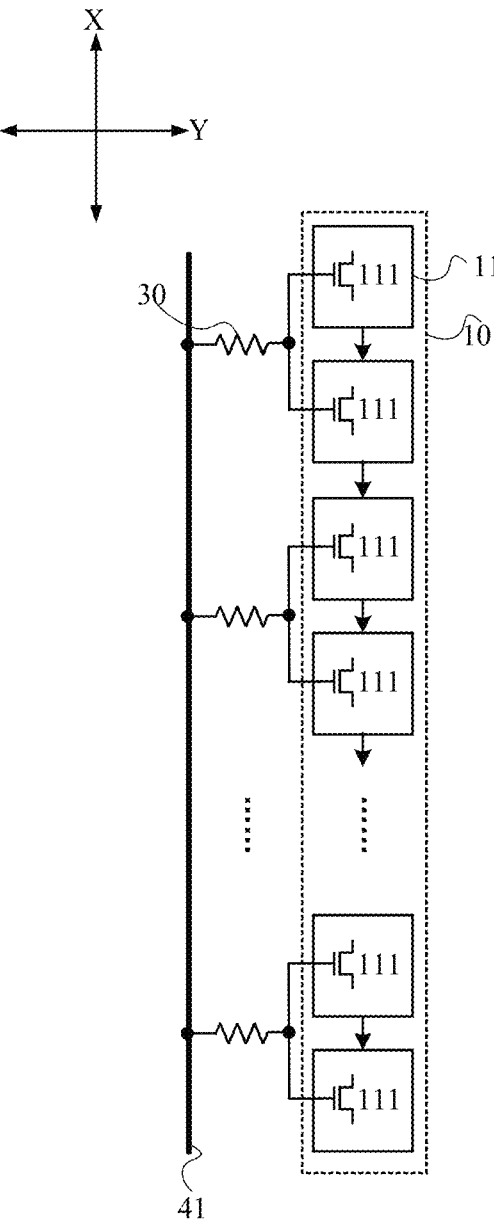
FIG. 19 shows another schematic view of a connection of traces and a circuit in a display panel according to embodiments of the present application.

As another example, as shown in FIG. 19, under a condition that the resistor structures 30 are connected between the shift registers 11 and the power supply trace 41, one resistor structure 30 may be connected to the first transistors 111 of the plurality of shift registers 11. For example, one resistor structure 30 may be connected to the first transistors 111 of two shift registers 11. In this embodiment, one resistor structure 30 is shared by the plurality of shift registers 11.

In some other embodiments, as shown in FIG. 2, the resistor structure 30 is connected between the driving chip 200 and the power supply trace 41. Specifically, the display panel includes the power supply trace 41 for transmitting the power supply voltage VDD, and the power supply trace 41 is electrically connected to at least two stages of shift registers 11 and connected between the resistor structure 30 and the first transistors 111. The driving chip 200 is configured to provide the power supply voltage VDD, and the power supply voltage VDD output by the driving chip 200 is first transmitted to the resistor structure 30, next to the power supply trace 41, and then to each first transistor 111. It may be understood that, in this embodiment, the resistor structure 30 is shared by the plurality of shift registers, so that the first transistors of the plurality of shift registers can be protected while reducing the total number of the resistor structures.

In an example, under a condition that the resistor structures are connected between the power supply trace and the first transistors, or under a condition that the power supply trace is connected between the resistor structure and the first transistors, traces of the resistor structures include, but are not limited to, the square wave, the zigzag, the serpentine, and the like in shape; the positions of the film layers of the resistor structures include, but are not limited to: at least a part of the segments of the resistor structure and the power supply trace being located in different film layers, at least a part of the segments of the resistor structure being located in the same film layer as the active layer of the first transistor, at least a part of the segments of the resistor structure being located in the transparent conductive layer, at least a part of the segments of the resistor structure being located in the same film layer as the pixel electrode and/or the common electrode of the display panel, and the like.

In some embodiments, the effect of the impedance of the power supply trace 41 on the shift registers of each stage is considered, so that the resistance of the resistor structures connected to at least two different shift registers may be set to be different.

Figure 20:
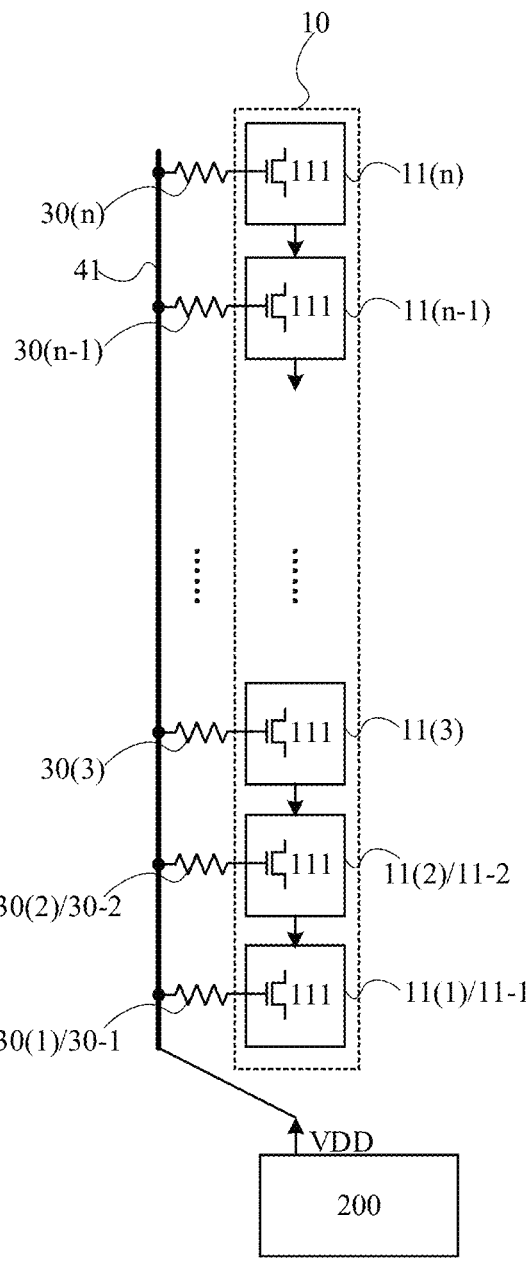
FIG. 20 shows yet another schematic view of a connection of traces and a circuit in a display panel according to embodiments of the present application.

In an example, as shown in FIG. 20, the plurality of shift registers 11 include the first shift register 11-1 and the second shift register 11-2, and the resistor structures include the first sub-resistor structure 30-1 and the second sub-resistor structure 30-2; the first sub-resistor structure 30-1 is connected between the power supply trace 41 and the first shift register 11-1, and the second sub-resistor structure 30-2 is connected between the power supply trace 41 and the second shift register 11-2; the transmission path length of the power supply voltage VDD provided for the first shift register 11-1 in the power supply trace 41 is less than the transmission path length of the power supply voltage VDD provided for the second shift register 11-2 in the power supply trace 41, and the resistance of the first sub-resistor structure 30-1 is greater than the resistance of the second sub-resistor structure 30-2.

For example, the shift registers from the first shift register 11 (1) to the n-th shift register 11 (n) are arranged along the first direction X and the direction away from the driving chip 200 and connected to the power supply trace 41 through the resistor structures from the first resistor structure 30 (1) to the n-th resistor structure 30 (n), respectively, the first shift register may be the i-th shift register, the second shift register may be the j-th shift register, 1≤i<j≤n, i and j are integers.

In an example, lengths of the transmission paths of the power supply voltage VDD provided for the shift registers from the first shift register 11 (1) to the n-th shift register 11 (n) in the power supply trace 41 are increased in sequence, and resistance of the resistance structures from the first resistance structure 30 (1) to the n-th resistance structure 30 (n) may be decreased in sequence.

It may be understood that, in the embodiments of the present application, the impedances of the transmission paths of the power supply voltage received by different shift registers may be equalized, thereby improved the display uniformity while protecting the first transistors in the shift registers.

In some embodiments, the impedance of the resistor structure may be stable.

In some other embodiments, the impedance of the resistor structure may be variable. For example, the resistor structure has different impedances under different operating conditions of the display panel. In this way, different protection requirements for the first transistors in the shift registers under different operating conditions are satisfied.

The inventor has found that the higher the temperature is, the greater the conductivity of the active layer in the transistor is, the greater the current passing through the transistor is, and the greater the damage to the first transistor due to the change in the power supply voltage is. As an example, as the temperature increases, the impedance of the resistor structure becomes greater. Thus, the problem that the first transistors are easily damaged under the high temperature is reduced.

In some embodiments, as shown in FIG. 5 to FIG. 7, the gate of the first transistor 111 and the first electrode thereof need to be provided with the power supply voltage VDD, and at least the gate of the first transistor 111 is provided with the supply voltage VDD through the resistor structure 30. Whether the first transistor is turned on or not is mainly affected by the potential of the gate thereof, therefore, the gate thereof is provided with the power supply input signal through the resistor structure, so that the impact of the great current on the gate of the first transistor due to an excessive instantaneous change of the provided power supply voltage may be reduced, that is, the direct impact of the change of the power supply voltage on the gate of the first transistor is avoided to reduce the problem that the first transistor is easily damaged.

Figure 21:
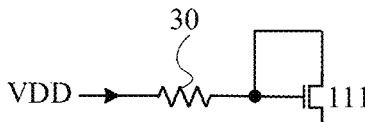
FIG. 21 shows a schematic view of a connection of a resistor structure and a first transistor in a display panel according to embodiments of the present application.
Figure 22:
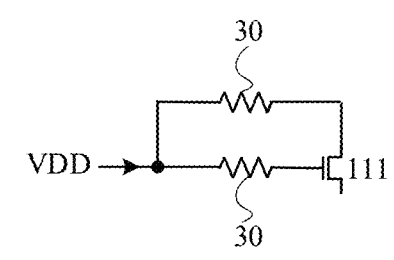
FIG. 22 shows another schematic view of a connection of a resistor structure and a first transistor in a display panel according to embodiments of the present application.

In other examples, as shown in FIG. 21 and FIG. 22, the gate of the first transistor 111 and the first electrode thereof are provided with the power supply voltage VDD through the resistor structure 30. For example, as shown in FIG. 21, the gate of the first transistor 111 and the first electrode thereof are provided with the power supply voltage VDD through one resistor structure 30; or as shown in FIG. 22, the gate of the first transistor 111 and the first electrode thereof are provided with the power supply voltage VDD through different resistor structures 30.

In some embodiments, the operation phase of the display panel includes the first phase in which the power supply voltage VDD is at the first level, and the first level controls the first transistor 111 to be turned on. For example, the first transistor 111 is the N-type transistor, and the first level is the high potential vgh; or the first transistor 111 is the P-type transistor, and the first level is the low potential vgl. Herein, the high potential vgh may be approximately 30V, and the low potential vgl may be approximately −10V.

In an example, under a condition that the operation phase of the display panel includes the first phase, as shown in FIG. 6 or FIG. 7, the shift register may include only one first transistor.

In some embodiments, as shown in FIG. 5, the shift register includes two first transistors which are the transistor M16 and the transistor M17, respectively; the resistor structure 30 includes the first resistor structure 31 and the second resistor structure 32, and the power supply voltage VDD includes the first power supply voltage VDD1 and the second power supply voltage VDD2, one of the first transistors (such as the transistor M16) is provided with the first power supply voltage VDD1 through the first resistor structure 31, and the other of the first transistor (such as the transistor M17) is provided with the second power supply voltage VDD2 through the second resistor structure 32.

The shift register shown in FIG. 5 includes two pull-down maintenance modules, and the first power supply voltage VDD1 and the second power supply voltage VDD2 are each responsible for controlling one pull-down maintenance module.

Figure 23:
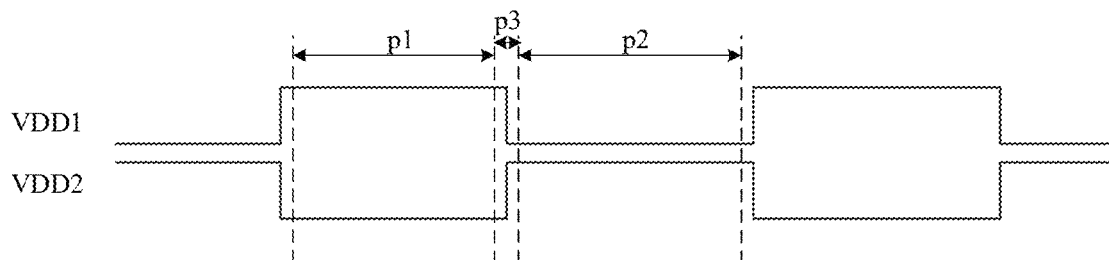
FIG. 23 shows a schematic view of a time sequence of a power supply voltage according to embodiments of the present application.

For example, as shown in FIG. 23, the first power supply voltage VDD1 and the second power supply voltage VDD2 are signals with interleaved high level and low level; specifically, the operation phase of the display panel includes the first phase p1 and the second phase p2 which are provided alternately, in the first phase p1, the first power supply voltage VDD1 is at the first level, the second power supply voltage VDD2 is at the second level, in the second phase p2, the first power supply voltage VDD1 is at the second level, and the second power supply voltage VDD2 is at the first level; the second level is lower than the first level, the first level controls the first transistor to be turned on, and the second level controls the first transistor to be turned off. In this embodiment, an example in which the first transistor is the N-type transistor is given for illustration. It may be understood that the same applies for the P-type first transistor, and under a condition that the first transistor is the P-type transistor, the first level is less than the second level.

The first power supply voltage VDD1 and the second power supply voltage VDD2 are signals with interleaved high level and low level, so that one of the pull-down maintenance modules is in operation while the other of the pull-down maintenance modules is at rest, and each of the two pull-down maintenance modules is at rest for half of the given duration, thereby increasing the reliability of the shift registers.

The first power supply voltage VDD1 and the second power supply voltage VDD2 are signals with different time sequences and may be transmitted by different traces. For example, as shown in FIG. 5, the display panel further includes the power supply traces 41, and the power supply traces 41 include the first power supply trace 411 for transmitting the first power supply voltage VDD1 and the second power supply trace 412 for transmitting the second power supply voltage VDD2.

In an example, the first resistor structure 31 may be connected between the first power supply trace 411 and one of the first transistors, or the first power supply trace 411 may be connected between the first resistor structure 31 and one of the first transistors.

The second resistor structure 32 may be connected between the second power supply trace 412 and the other of the first transistors, or the second power supply trace 412 may be connected between the second resistor structure 32 and the other of the first transistors.

Shape features, material features, film layers, and the like of the first resistor structure 31 and/or the second resistor structure 32 may be described as the resistor structure 30 in the above embodiments, which is not repeated herein.

In some embodiments, still referring to FIG. 23, the operation phase of the display panel further includes the third phase p3 in which the level of the first power supply voltage VDD1 and the level of the second power supply voltage VDD2 are changed, the third phase p3 is located between the first phase p1 and the second phase p2, the first phase p1 and the second phase p2 include frame phases, and the third phase p3 includes the blanking phase located between adjacent two of the frame phases. The blanking phase may be referred to as the blank phase.

In the frame phases, each stage of shift registers of the gate driving circuit output effective pulse signals one by one to carry out progressive scanning of the pixels and write data voltages into the corresponding pixels, so that the display panel displays normally. In the blanking phase, the gate driving circuit does not output the effective pulse signals and does not write the data voltages, therefore, the first power supply voltage VDD1 and the second power supply voltage VDD2 are provided in the blanking phase for the level changing, which does not affect the normal display of the display panel.

In an example, the duration of the first phase p1 is great than the duration of the third phase p3, and the duration of the second phase p2 is greater than the duration of the third phase p3.

In an example, the duration of the first phase p1 is equal to the duration of the second phase p2.

In the above embodiments, the voltage changing process of the power supply voltage actually received by the first transistors is elongated by adding resistor structures in the display panel to reduce the impact of the great current on the first transistors due to the excessive instantaneous change of the provided power supply voltage.

Based on the same inventive concept, the power supply voltage output by the driving chip may be changed directly; for example, the delay of the change of the power supply voltage output by the driving chip is increased, that is, the duration for changing the levels of the power supply voltage output by the driving chip is increased to directly avoid the impact of the direct jump of the power supply voltage in a short duration on the first transistor, thereby protecting the first transistor from being damaged.

Specifically, embodiments of the present application further provide a driving chip, as shown in FIG. 24 to FIG. 27, the driving chip is configured to provide the power supply voltage VDD for the gate driving circuit in the display panel, the power supply voltage VDD provided by the driving chip is at the first level in the first phase p1, at the second level in the second phase p2, and at the third level in the third phase p3, the third phase p3 is located between the first phase p1 and the second phase p2, the third level is between the first level and the second level, and at the first level, the first transistor in the gate driving circuit is turned on.

It should be noted that, in the time sequence chart of the present application, the first level is the high potential, the second level is the low potential, and the first transistor is the N-type transistor, which is not intended to limit the present application. The same applies for the P-type first transistor, under a condition that the first transistor is the P-type transistor, the first level is the low level, and the second level is the high level.

The third phase p3 is the changing phase in which the power supply voltage VDD is changed between the first level and the second level, that is, in the embodiments of the present application, the power supply voltage output by the driving chip is changed directly, and the duration for changing the levels of the power supply voltage output by the driving chip is increased to directly avoid the impact of the direct jump of the power supply voltage in a short duration on the first transistor, thereby protecting the first transistor from being damaged.

In some embodiments, the gate driving circuit is further provided with the clock signal, the duration for the clock signal to jump from the first level to the second level is t2, the duration of the third phase is t1, and t1>t2 That is, the duration for changing the levels of the power supply voltage VDD output by the driving chip is greater than the duration for changing the levels of the clock signal.

In other examples, the specific duration of the third phase may be set as needed.

In some embodiments, the blanking stage is included between adjacent frames of the display panel, the third stage is subordinate to the blanking stage, the duration of the third phase is t1, the duration of the blanking phase is $t_{blank}$, and $t1 \leq t_{blank}$.

In the frame phases, each stage of shift registers of the gate driving circuit output effective pulse signals one by one to carry out progressive scanning of the pixels and control the pixels to emit light, so that the display panel displays normally. In the blanking phase, the gate driving circuit does not output effective pulse signals, therefore, the power supply voltage VDD is provided in the blanking phase for the level changing, which does not affect the normal display of the display panel.

In some embodiments, the third level is the gradually changing level. That is, the power supply voltage VDD gradually transitions from the first level to the second level, and the less the variation of the power supply voltage VDD is, the less the current on the transmission path thereof is, which is more beneficial to protect the first transistor.

Figure 24:
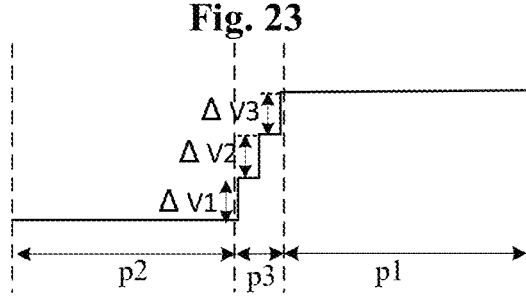
FIG. 24 shows a schematic view of a time sequence of a power supply voltage output by a driving chip according to embodiments of the present application.

As an example, as shown in FIG. 24, the third level of the power supply voltage VDD in the third phase p3 changes in a step-like manner.

Specifically, under a condition that the third level of the power supply voltage VDD in the third phase p3 changes in the step-like manner, the variation of the third level may be the same each time. For example, ΔV1=ΔV2=ΔV3.

This embodiment may ensures that under a condition that the power supply voltage VDD changes each time, the Vgs of the first transistor is the same, that is, the impact on the first transistor is the same, so that the greater impact on the first transistor is avoided.

Figure 25:
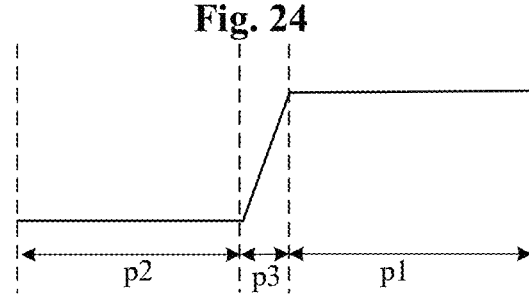
FIG. 25 shows another schematic view of a time sequence of a power supply voltage output by a driving chip according to embodiments of the present application.

As another example, as shown in FIG. 25, the third level of the power supply voltage VDD in the third phase p3 changes in a diagonal line.

Figure 26:
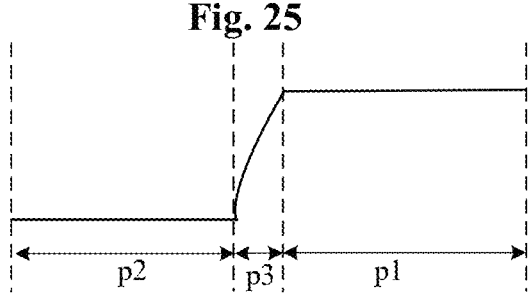
FIG. 26 shows yet another schematic view of a time sequence of a power supply voltage output by a driving chip according to embodiments of the present application.
Figure 27:
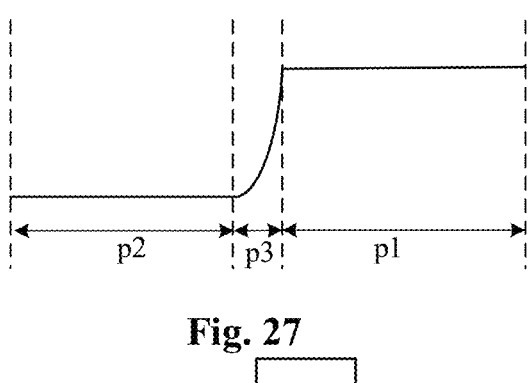
FIG. 27 shows yet another schematic view of a time sequence of a power supply voltage output by a driving chip according to embodiments of the present application.

As yet another example, as shown in FIG. 26 or FIG. 27, the third level of the power supply voltage VDD in the third phase p3 changes in a curve.

Optionally, as shown in FIG. 26, the slope of the changing curve of the third level of the power supply voltage VDD in the third phase p3 is gradually reduced.

It should be noted that the changing forms of the third level of the power supply voltage VDD in the third phase p3 include, but are not limited to, the changing forms shown in FIG. 24 to FIG. 26.

Based on the same inventive concept, the signal delay structure may be added in the driving chip; for example, the signal delay structure includes the resistor structure to elongate the voltage changing process of the power supply voltage actually received by the first transistor, so as to reduce the impact of the great current on the first transistors due to the excessive instantaneous change of the provided power supply voltage.

Figure 28:
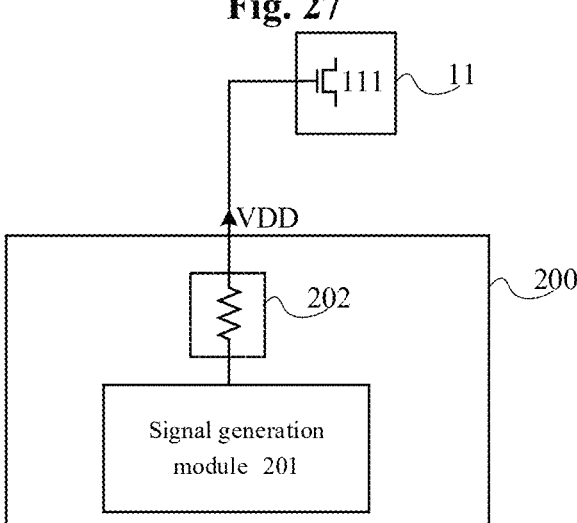
FIG. 28 shows a schematic structural view of a driving chip according to embodiments of the present application.

Specifically, as shown in FIG. 28, the driving chip 200 includes the signal generation circuit 201 and the signal delay structure 202, the signal generation circuit 201 is configured to generate the power supply voltage, one end of the signal delay structure 202 is electrically connected to an output of the signal generation circuit 201, and the other end of the signal delay structure 202 is electrically connected to the gate driving circuit in the display panel.

The signal delay structure 202 can elongate the voltage changing process of the power supply voltage actually received by the first transistor to reduce the impact of the great current on the first transistors due to the excessive instantaneous change of the provided power supply voltage.

For example, the signal delay structure 202 includes the resistor structure.

Figure 29:
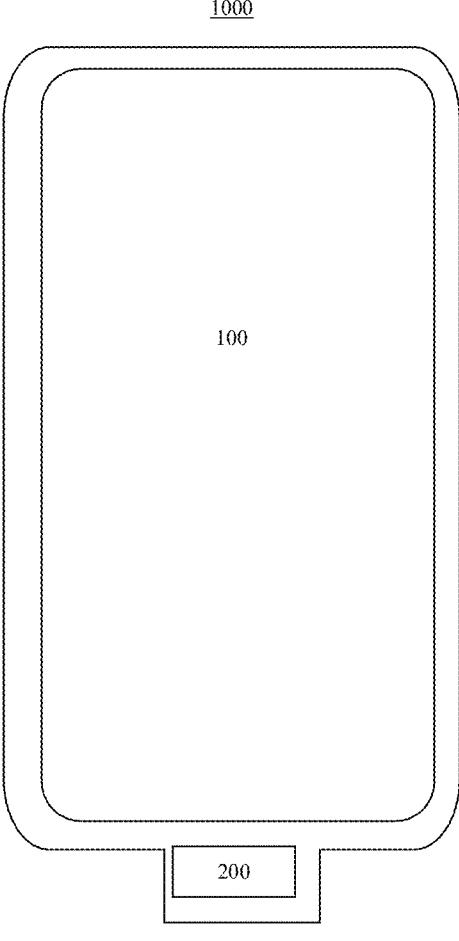
FIG. 29 shows a schematic structural view of a display apparatus according to embodiments of the present application.

The present application further provides a display apparatus including the display panel according to the present application, and/or including the driving chip according to the embodiments of the present application. With reference to FIG. 29 which is a schematic structural view of the display apparatus according to the embodiments of the present application. The display apparatus 1000 in FIG. 29 includes the display panel 100 according to any one of the above embodiments of the present application and/or the driving chip 200 according to any one of the above embodiments of the present application. In the embodiment of FIG. 29, the mobile phone is only given as an example to illustrate the display apparatus 1000, and it may be understood that, the display apparatus according to the embodiments of the present application may be other display apparatus with the display function, such as, a wearable product, a computer, a television, and a vehicle-mounted display apparatus, which are not are not particularly limited by the embodiments of the present application. The display apparatus according to the embodiments of the present application has the beneficial effects of the display panel according to the embodiments of the present application, reference is made to the specific description of the display panel in the above embodiments for details, which are not repeated herein.

It should be noted that the transistors in the embodiments of the present application may be the N-type transistors or the P-type transistors. For the N-type transistors, the ON-level is the high level and the OFF-level is the low level. That is, the N-type transistors are turned on under a condition that gate potential of the N-type transistors is at the high level and are turned off under a condition that gate potential of the N-type transistors is at the low level. For the P-type transistors, the ON-level is the low level and the OFF-level is the high level. That is, the P-type transistors are turned on under a condition that gate potential of the P-type transistors is at the low level and are turned off under a condition that gate potential of the P-type transistors is at the high level.

In specific embodiments, the gate of the transistor is used as its control terminal, and depending on a signal of the gate and the type of the transistor, its first terminal may be used as the source and its second terminal may be used as the drain, or alternatively, its first terminal may be used as the drain and its second terminal may be used as the source, which is not limited herein. Further, the ON-level and the OFF-level are used in a general sense in the embodiments of the present application, the ON-level refers to any level that can turn on the transistor, and the OFF-level refers to any level that can cut off/turn off the transistor.

It should be noted that in the above embodiments shown in the drawings, the resistor is represented by a single resistor, and the capacitor is represented by a single capacitor. In other embodiments, the resistor may be an integration of resistors in series, resistors in parallel, resistors in or series-parallel, and the capacitor may be an integration of capacitors in series, capacitors in parallel, or capacitors in series-parallel. The specific parameters of various devices may be set based on actual requirements, which is not limited in the present application.

The above embodiments of the present application do not exhaustively describe all the details and do not limit the present application to only the specific embodiments described. Obviously, many modifications and variations can be made based on the above description. These embodiments are selected and specifically described in the description to better explain the principles and practical applications of the present application, so that those skilled in the art can make good use of the present application and make modifications based on the present application. The present application is limited only by the claims, along with their full scope and equivalents.

What is claimed is:

1. A display panel comprising:
   a gate driving circuit comprising a plurality of shift registers in a cascaded connection, the plurality of shift registers being arranged along a first direction, a shift register of the plurality of shift registers comprising a first transistor;
   a power supply trace that is configured to transmit power supply voltage and extends along the first direction; and a connection line that is connected between the power supply trace and the first transistor and includes a resistor structure, wherein the first transistor is provided with the power supply voltage through the resistor structure.

2. The display panel according to claim 1, wherein the resistor structure comprises a first trace, and an impedance of per unit length of at least a part of segments of the first trace is greater than an impedance of per unit length of the power supply trace.

3. The display panel according to claim 1, wherein the resistor structure comprises a first trace, and a trace width of the first trace is less than a trace width of the power supply trace.

4. The display panel according to claim 1, wherein the resistor structure comprises a first trace that comprises a meander line.

5. The display panel according to claim 1, wherein the resistor structure comprises at least a first segment, and the first segment and the power supply trace are located in different layers.

6. The display panel according to claim 5, wherein the first segment comprises a transparent conductive material or a semiconductor material.

7. The display panel according to claim 5, wherein the display panel further comprises a pixel electrode and a common electrode, the first segment and the pixel electrode are located in a same layer, and/or, the first segment and the common electrode are located in the same layer;

the display panel further comprises a base plate;

the pixel electrode and the common electrode are located on one side of the base plate; and the pixel electrode and the common electrode are located in a same layer, or a film layer where the pixel electrode is located is located between a film layer where the common electrode is located and the base plate, or the film layer where the common electrode is located is located between the film layer where the pixel electrode is located and the base plate.

8. The display panel according to claim 5, wherein the first transistor comprises an active layer, and the first segment and the active layer of the first transistor are located in the same layer.

9. The display panel according to claim 5, wherein the display panel comprises a plurality of transmission signal traces electrically connected to the gate driving circuit, and the transmission signal traces comprise the power supply trace; and along a direction perpendicular to a plane where the display panel is located, the first segment overlaps with a transmission signal trace of the plurality of transmission signal traces adjacent to the power supply trace.

10. The display panel according to claim 1, wherein the display panel comprises a plurality of transmission signal traces electrically connected to the gate driving circuit, and the transmission signal traces comprise the power supply trace;

the plurality of shift registers of the gate driving circuit are arranged along a first direction; and the display panel comprises a trace area, a circuit area, and a resistor area, the transmission signal traces are located in the trace area, the gate driving circuit is located in the circuit area, the resistor structure is located in the resistor area, along a second direction, the resistor area is located between the trace area and the circuit area, and the second direction intersects the first direction.

11. The display panel according to claim 1, wherein an impedance of the resistor structure is variable; and the impedance of the resistor structure becomes greater as the temperature increases.

12. The display panel according to claim 1, wherein the plurality of the shift registers comprise a first shift register and a second shift register, the resistor structure comprises a first sub-resistor structure and a second sub-resistor structure, the first sub-resistor structure is connected between the power supply trace and the first shift register, the second sub-resistor structure is connected between the power supply trace and the second shift register, a transmission path length of the power supply voltage provided for the first shift register in the power supply trace is less than a transmission path length of the power supply voltage provided for the second shift register in the power supply trace, and resistance of the first sub-resistor structure is greater than resistance of the second sub-resistor structure.

13. The display panel according to claim 1, wherein the power supply trace is electrically connected to at least two stages of shift registers and connected between the resistor structure and the first transistor.

14. The display panel according to claim 1, wherein a gate of the first transistor and a first electrode thereof are provided with the power supply voltage, and at least the gate of the first transistor is provided with the power supply voltage through the resistor structure.

15. The display panel according to claim 1, wherein the resistor structure comprises a first resistor structure and a second resistor structure, the shift register comprises two first transistors, the power supply voltage comprises a first power supply voltage and a second power supply voltage, one of the first transistors is provided with the first power supply voltage through the first resistor structure, and the other of the first transistors is provided with the second power supply voltage through the second resistor structure;

the display panel comprises a plurality of the power supply traces, and the power supply traces comprise a first power supply trace for transmitting the first power supply voltage and a second power supply trace for transmitting the second power supply voltage;

an operation phase of the display panel comprises a first phase and a second phase which are provided alternately, in the first phase, the first power supply voltage is at a first level, the second power supply voltage is at a second level, in the second phase, the first power supply voltage is at the second level, and the second power supply voltage is at the first level; and the second level is lower than the first level, the first level controls the first transistor to be turned on, and the second level controls the first transistor to be turned off.

16. The display panel according to claim 15, wherein the operation phase of the display panel further comprises a third phase in which a level of the first power supply voltage and a level of the second supply voltage are changed, the third phase is located between the first phase and the second phase, the first phase and the second phase comprise frame phases, and the third phase comprises a blanking phase located between adjacent two of the frame phases.

17. A driving chip configured to provide a power supply voltage for a gate driving circuit in a display panel, wherein the power supply voltage provided by the driving chip is at a first level in the first phase, at a second level in a second phase, and at a third level in a third phase, the third phase is located between the first phase and the second phase, the third level is between the first level and the second level, at the first level, a first transistor in the gate driving circuit is turned on, and at the second level, the first transistor in the gate driving circuit is turned off.

18. He driving chip according to claim 17, wherein the third level is a gradually changing level.

19. A display apparatus comprising a display panel, the display panel comprising:

a gate driving circuit comprising a plurality of shift registers in a cascaded connection, the plurality of shift registers being arranged along a first direction, a shift register of the shift registers comprising a first transistor;

a power supply trace that is configured to transmit power supply voltage and extends along the first direction; and a connection line that is connected between the power supply trace and the first transistor and includes a resistor structure, wherein the first transistor is provided with the power supply voltage through the resistor structure.

\* \* \* \* \*